(12) United States Patent
Oh et al.

(10) Patent No.: US 7,759,234 B2
(45) Date of Patent: Jul. 20, 2010

(54) METHOD FOR FABRICATING SEMICONDUCTOR DEVICE WITH RECESS GATE

(75) Inventors: Sang-Rok Oh, Ichon-shi (KR); Jae-Seon Yu, Ichon-shi (KR)

(73) Assignee: Hynix Semiconductor Inc., Ichon-Shi, Kyoungki-Do (KR)

( * ) Notice: Subject to any disclaimer, the term of this patent is extended or adjusted under 35 U.S.C. 154(b) by 277 days.

(21) Appl. No.: 11/952,431

(22) Filed: Dec. 7, 2007

(65) Prior Publication Data

US 2008/0227281 A1 Sep. 18, 2008

(30) Foreign Application Priority Data

Mar. 15, 2007 (KR) .................. 10-2007-0025401

(51) Int. Cl.
 *H01L 21/3205* (2006.01)
 *H01L 21/4763* (2006.01)
(52) U.S. Cl. ............... 438/585; 438/589; 257/E21.545; 257/E21.294
(58) Field of Classification Search ........... 438/424, 438/585, 589, 270, 703; 257/E21.545, E21.294, 257/E21.249, E21.41, 401
See application file for complete search history.

(56) References Cited

U.S. PATENT DOCUMENTS

| 7,164,170 | B2 * | 1/2007 | Kim .................... 257/330 |
| 2006/0113590 | A1 * | 6/2006 | Kim et al. ............ 257/330 |
| 2006/0270185 | A1 * | 11/2006 | Lee ..................... 438/424 |
| 2006/0286728 | A1 | 12/2006 | Kim et al. |
| 2007/0155076 | A1 * | 7/2007 | Kim .................... 438/197 |
| 2007/0259498 | A1 * | 11/2007 | Chang et al. ........ 438/270 |
| 2007/0281455 | A1 * | 12/2007 | Kim .................... 438/589 |

| 2008/0001215 | A1 * | 1/2008 | Jung .................... 257/330 |

(Continued)

FOREIGN PATENT DOCUMENTS

CN 1892988 1/2007

(Continued)

OTHER PUBLICATIONS

Chinese Patent Certificate for Chinese Patent 200710195329.8.

(Continued)

*Primary Examiner*—Walter L Lindsay, Jr.
(74) *Attorney, Agent, or Firm*—Lowe Hauptman Ham & Berner LLP

(57) ABSTRACT

A method for fabricating a semiconductor device includes forming a sacrificial layer having a stack structure of a first insulation layer, a first conductive layer and a second insulation layer over a substrate, forming a recess by etching the sacrificial layer and the substrate, forming a gate insulation layer over a recess surface, filling a second conductive layer in the recess and between etched sacrificial layers, forming a gate electrode metal layer, a gate hard mask layer and a gate mask pattern over a resultant substrate, etching layers formed below the gate mask pattern by using the gate mask pattern until the first conductive layer is exposed, thereby forming an initial gate pattern, forming a capping layer on a sidewall and a top portion of the initial gate pattern, and etching an exposed portion by using the capping layer as a mask until the first insulation layer is exposed, thereby forming a final gate pattern.

19 Claims, 4 Drawing Sheets

U.S. PATENT DOCUMENTS

| | | | |
|---|---|---|---|
| 2008/0160737 A1* | 7/2008 | Oh et al. | 438/585 |
| 2008/0185641 A1* | 8/2008 | Kim et al. | 257/330 |
| 2009/0148994 A1* | 6/2009 | Yamazaki | 438/270 |
| 2009/0159965 A1* | 6/2009 | Jung | 257/331 |

FOREIGN PATENT DOCUMENTS

| | | |
|---|---|---|
| KR | 1020060083707 | 7/2006 |
| KR | 1020070002735 | 1/2007 |

OTHER PUBLICATIONS

Korean Notice of Allowance for Korean patent application No. 10-2007-0025401, citing the above references.

* cited by examiner

METHOD FOR FABRICATING SEMICONDUCTOR DEVICE WITH RECESS GATE

CROSS-REFERENCES TO RELATED APPLICATIONS

The present invention claims priority of Korean patent application number 2007-0025401, filed on Mar. 15, 2007, which is incorporated by reference in its entirety.

BACKGROUND OF THE INVENTION

The present invention relates to a method for fabricating a semiconductor device and, more particularly, to a method for fabricating a semiconductor device with a recess gate.

As semiconductor devices have been highly integrated, a channel length of a memory cell transistor becomes shorter, so that refresh characteristics of the device have been significantly degraded.

In order to solve the above problem, a recess gate process has been suggested. According to the recess gate process, a predetermined gate region formed on an active area of a substrate is etched to form a recess, and a gate is formed on the recess to fabricate the transistor, so that the channel length is increased, thereby enhancing the refresh characteristics of the device. In addition, as the integration degree has been gradually increased, a bulb-type recess gate process has been suggested. According to the bulb type recess gate process, the recess is formed through a two-step etching process, so that the channel length is further increased.

Hereinafter, the recess gate process or the bulb-type recess gate process will be briefly described.

First, the substrate is selectively etched to form the recess. In this case, the recess may have various profiles (for example, a vertical type or a bulb type). After that, a gate insulation layer, a polysilicon layer, a metal layer and a hard mask nitride layer are sequentially deposited on the entire surface of a resultant structure having the recess, and then are patterned, thereby forming a gate pattern.

In the above recess gate process, the alignment between the recess pattern and the gate pattern is a critical factor. However, since the pattern has a micro-size due to the high integration of the device, it is difficult to precisely align a recess mask layer and a gate mask layer, so that a misalignment occurs between the gate pattern and the recess (See FIG. 1). Such a misalignment prevents a contact area from being open in the following process for forming a landing plug contact, and causes a short when depositing landing plug polysilicon. As a result, the characteristics of the device and product yield are deteriorated.

SUMMARY OF THE INVENTION

Embodiments of the present invention are directed to provide a method for fabricating a semiconductor device with a recess gate, in which a sacrificial layer pattern having a multilayer structure is used to prevent a misalignment between a recess and a gate pattern, so that the device characteristics and the product yield can be improved.

In accordance with an aspect of the present invention, there is provided a method for fabricating a semiconductor device with a recess gate. The method includes forming a sacrificial layer having a stack structure, in which a first insulation layer, a first conductive layer and a second insulation layer are sequentially stacked, on a substrate; forming a recess by etching the sacrificial layer and the substrate using a recess mask; forming a gate insulation layer on a surface of the recess; filling a second conductive layer in the recess and between etched sacrificial layers; forming a gate electrode metal layer, a gate hard mask layer and a gate mask pattern on a resultant substrate filled with the second conductive layer; etching layers formed below the gate mask pattern by using the gate mask pattern until the first conductive layer is exposed, thereby forming an initial gate pattern; forming a capping layer on a sidewall and a top portion of the initial gate pattern; and etching an exposed portion by using the capping layer as a mask until the first insulation layer is exposed, thereby forming a final gate pattern.

DESCRIPTION OF SPECIFIC EMBODIMENTS

FIGS. 2A to 2F are cross-sectional views of a method for fabricating a semiconductor device according to an embodiment of the present invention.

Figure 1:
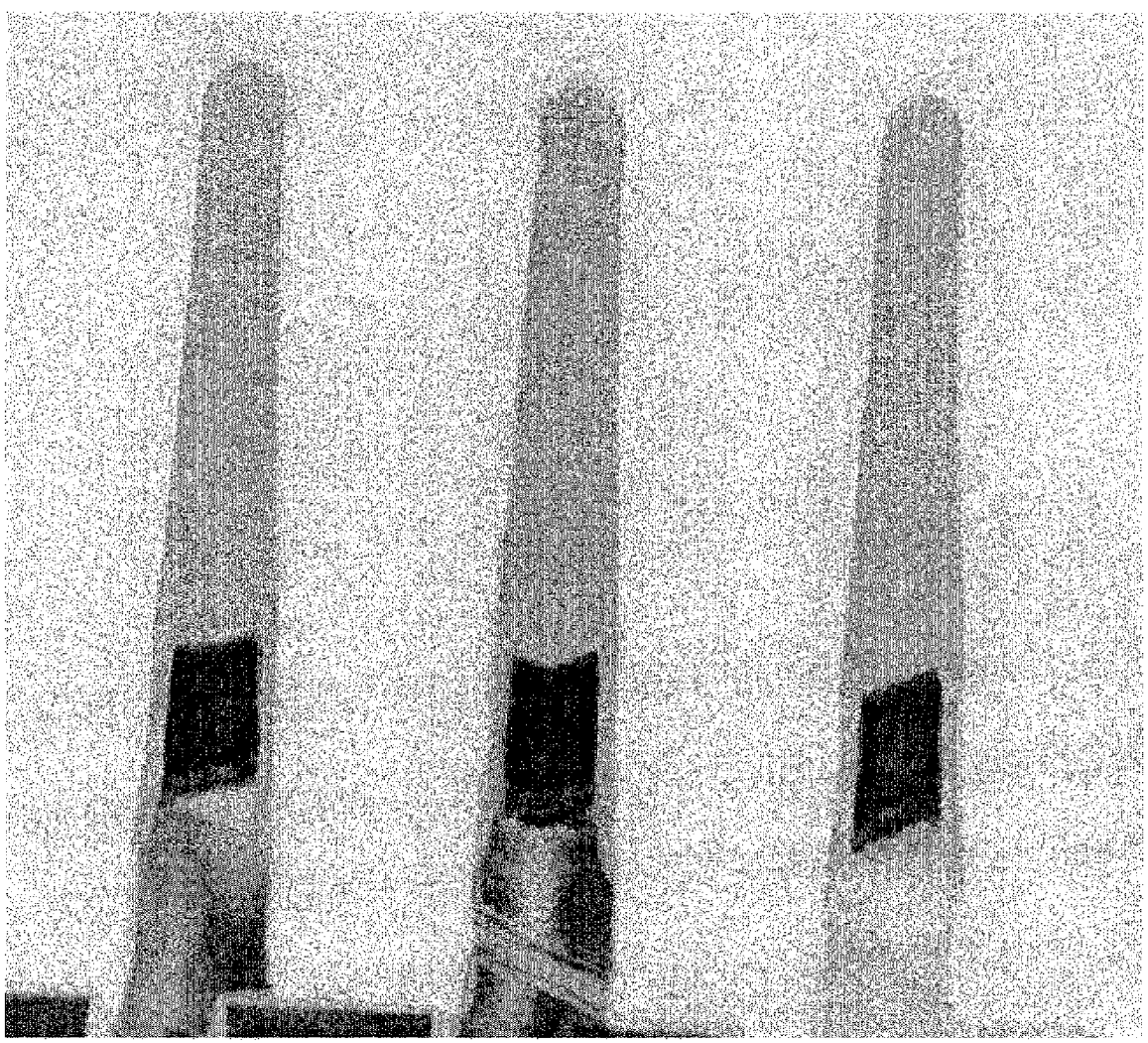
FIG. 1 is a micrographic view illustrating a misalignment between a recess and a gate pattern of a typical semiconductor device.
Figure 2A:
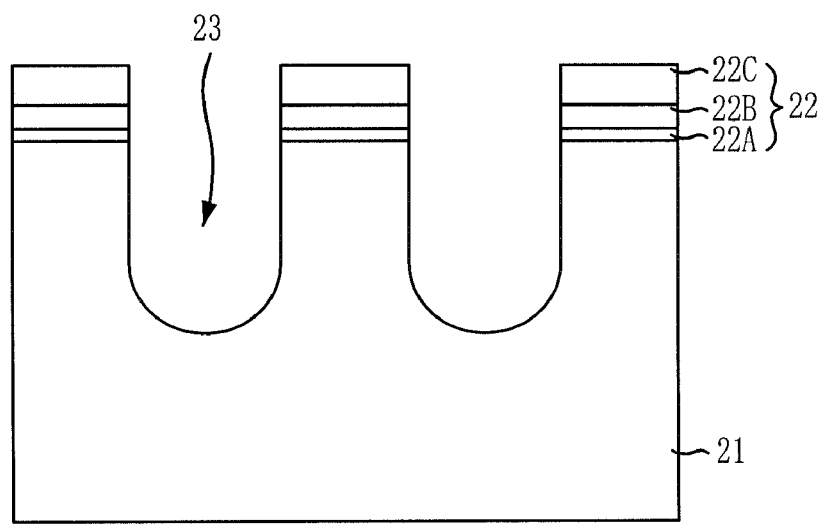
FIGS. 2A to 2F are cross-sectional views of a method for fabricating a semiconductor device according to an embodiment of the present invention.

Referring to FIG. 2A, a sacrificial layer 22 having a stack structure, in which a first oxide layer 22A, a polysilicon layer 22B and a second oxide layer 22C are sequentially stacked, is formed over a substrate 21. The first oxide layer 22A or the second oxide layer preferably includes a boro-phospho-silicate glass (BPSG) layer or a tetra-ethyl-ortho-silicate (TEOS) layer.

After that, the sacrificial layer 22 is etched by using a recess mask (not shown) to expose a predetermined recess region, and then the substrate 21 is etched by a predetermined depth, thereby forming a recess 23.

Although the recess 23 according to an embodiment of the present invention has a vertical profile, the recess may have a bulb type profile according to another embodiment of the present invention. In order to form the bulb type recess, the recess having the vertical profile is primarily formed, and then forming a spacer on sidewalls of the recess and performing an isotropic etching on the substrate formed below the recess by using the spacer as a barrier must be additionally performed.

Figure 2B:
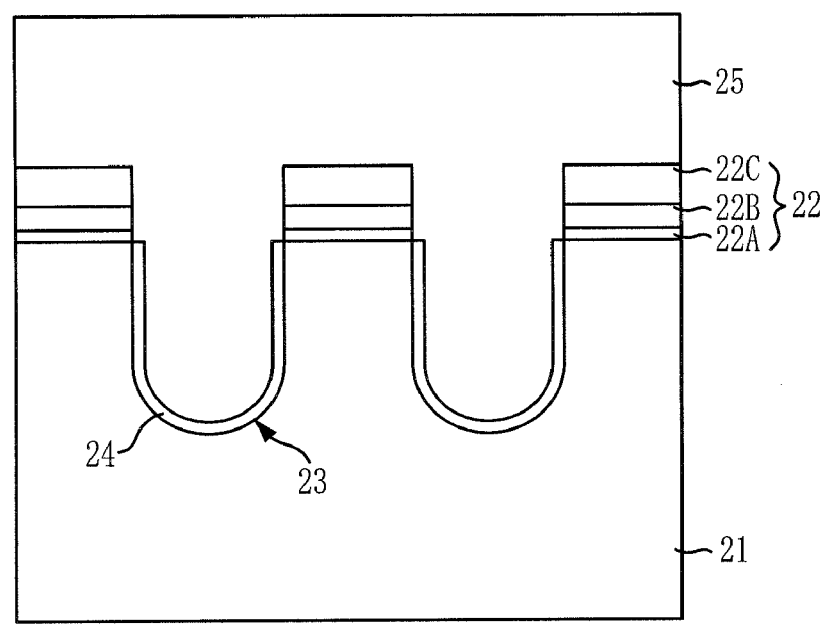

Referring to FIG. 2B, a gate oxide layer 24 is formed over a surface of the recess 23. The gate oxide layer 24 serves as a gate insulation layer for insulation between a gate and the substrate 21.

After that, a gate electrode polysilicon layer 25 is formed over the sacrificial layer 22, filling the recess 23.

Figure 2C:
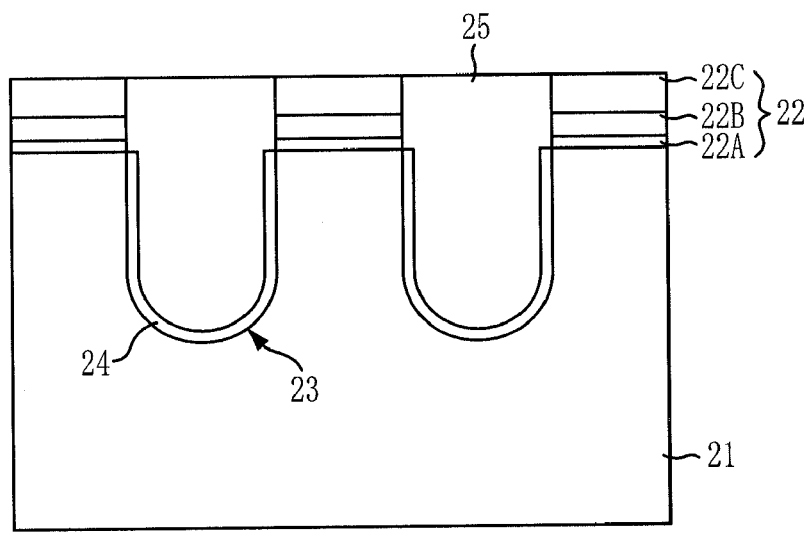

Referring to FIG. 2C, a planarization process is performed on the gate electrode polysilicon layer 25 until a surface of the sacrificial layer 22, that is, a surface of the second oxide layer 22C is exposed to the exterior, so that the gate electrode polysilicon layer 25 remains filling in the recess 23 and the region between sacrificial layer patterns. According to the present invention, for example, the gate electrode polysilicon layer 25 is planarized through a dry etch-back process, which is performed with a high etch selectivity ratio between the oxide layer and the polysilicon layer. Preferably, the etch-back process is performed by using a gas mixture of hydrogen bromide (HBr)/oxygen ($O_2$)/hexafluoroethane ($C_2F_6$) having a flow rate of approximately 50 sccm to approximately 100 sccm while applying a source power of approximately 300 W to approximately 500 W and a bias power of approximately 40 W to approximately 150 W.

Figure 2D:
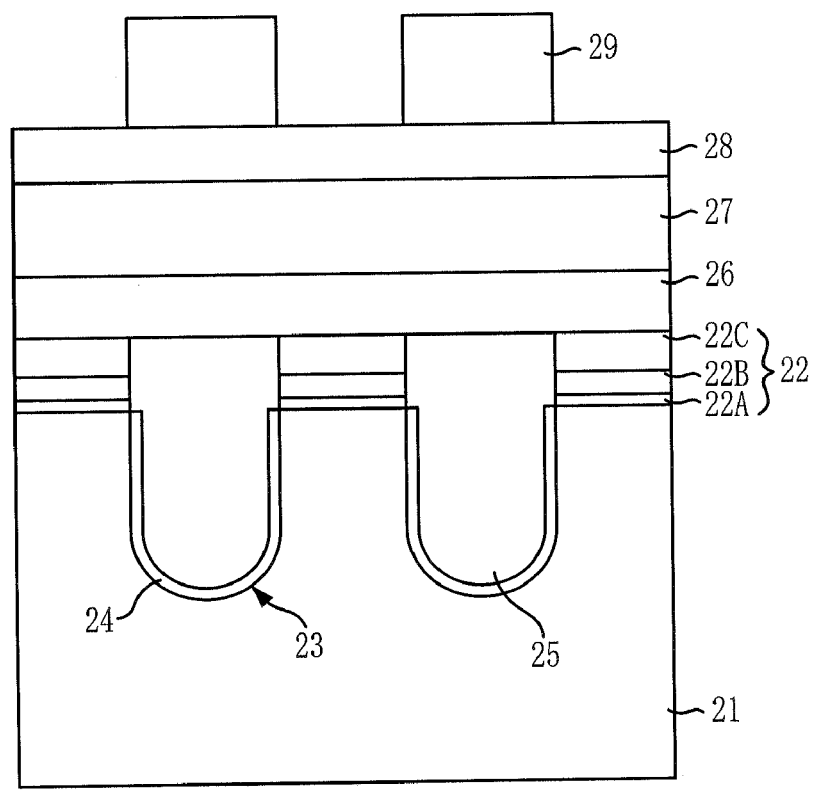

Referring to FIG. 2D, a gate electrode metal layer 26, a gate hard mask layer 27 and a gate mask layer 28 are sequentially formed over the planarized resultant structure. The gate electrode metal layer 26 preferably includes a tungsten (W)-based compound, for example, tungsten (W), tungsten nitride (WN), and tungsten silicide (WSix). In addition, the gate hard mask layer 27 preferably includes a nitride-based thin film, for example, silicon nitride ($Si_3N_4$), and the gate mask layer 28 preferably includes amorphous carbon.

After that, a photoresist pattern 29 is prepared over the gate mask layer 28 to form a gate pattern.

Figure 2E:
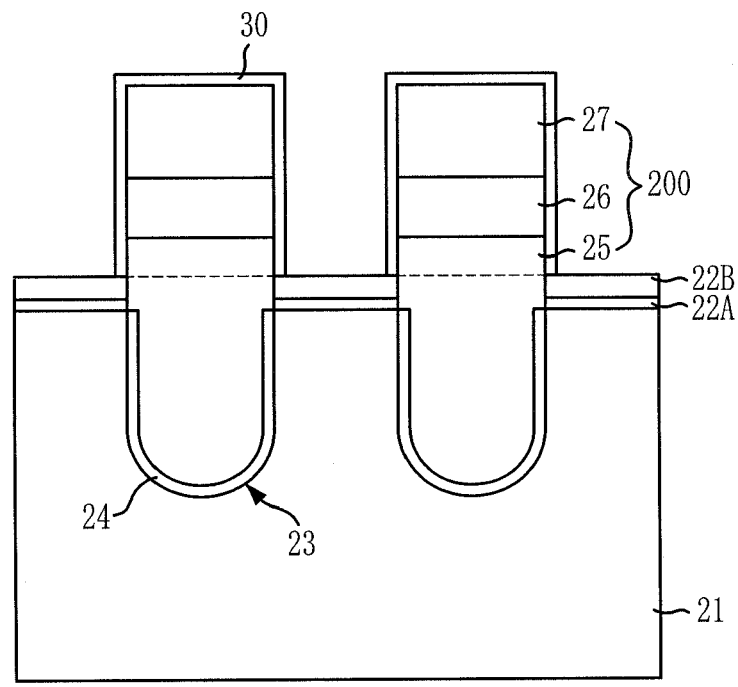

Referring to FIG. 2E, the gate mask layer 28 is etched by using the photoresist pattern 29 as an etch mask, thereby forming a gate mask pattern. After that, layers formed under the gate mask pattern are etched by using the gate mask pattern as an etch mask until the polysilicon layer 22B of the sacrificial layer 22 is exposed to the exterior. Then, the remaining photoresist pattern 29 and the gate mask pattern are removed.

As a result, the patterning for the gate hard mask layer 27 and the gate electrode metal layer 26 can be completed. However, the gate electrode polysilicon layer 25 is partially patterned. Accordingly, the patterning for the gate electrode polysilicon layer 25 must be completed through the subsequent process. Hereinafter, a stack structure, in which the completely patterned gate hard mask layer 27 and gate electrode metal layer 26 are stacked on the partially patterned gate electrode polysilicon layer 25, will be referred to as an initial gate pattern 200.

After that, a cleaning process is performed by using ozone ($O_3$), and a capping nitride layer 30 is formed on sidewalls and the top portion of the initial gate pattern 200. The capping nitride layer 30 serves to prevent the deformation of a profile caused by abnormal oxidation of the gate electrode metal layer 26 during the subsequent process. In the present invention, the capping nitride 30 also serves as a mask to perform the patterning process for the gate electrode polysilicon layer 25.

Figure 2F:
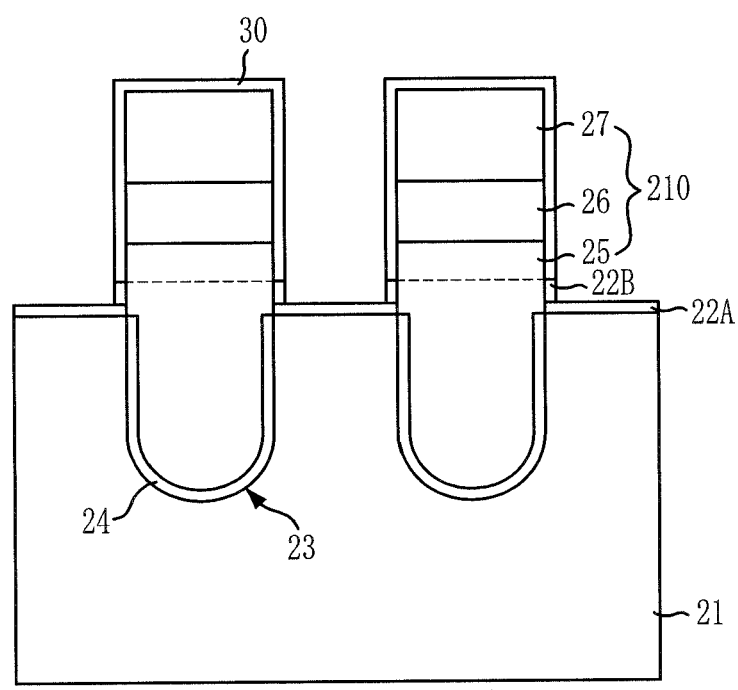

Referring to FIG. 2F, the exposed portion (polysilicon layer 22b or gate electrode polysilicon layer 25) is etched by using the capping nitride layer 30 as a mask until the first oxide layer 22A of the sacrificial layer 22 is exposed to the exterior, thereby forming a final gate pattern 210, in which the patterned gate electrode polysilicon layer 25, the gate electrode metal layer 26 and the gate hard mask layer 27 are stacked.

In the final gate pattern 210 obtained through the above procedure, a misalignment relative to the recess 23 filled with the gate electrode polysilicon layer 25 does not occur due to the polysilicon layer 22B formed below the capping nitride layer 30. According to the method for fabricating the semiconductor device with the recess gate, the recess is formed by using the sacrificial pattern having a multi-layer structure, so that the misalignment can be prevented between the recess and the gate pattern, thereby improving the characteristics and the product yield of the semiconductor devices.

While the present invention has been described with respect to the specific embodiments, the above embodiments of the present invention are illustrative and not limitative. It will be apparent to those skilled in the art that various changes and modifications may be made without departing from the spirit and scope of the invention as defined in the following claims.

What is claimed is:

1. A method for fabricating a semiconductor device, the method comprising:
    forming a sacrificial layer having a stack structure of a first insulation layer, a first conductive layer and a second insulation layer over a substrate;
    forming a recess by etching the sacrificial layers and the substrate;
    forming a gate insulation layer over a surface of the recess;
    filling a second conductive layer in the recess and a region between etched sacrificial layers;
    forming a gate electrode metal layer and a gate mask pattern over a resultant substrate filled with the second conductive layer;
    etching layers formed below the gate mask pattern by using the gate mask pattern until the first conductive layer is exposed, thereby forming an initial gate pattern;
    forming a capping layer on a sidewall and a top portion of the initial gate pattern; and
    etching an exposed portion by using the capping layer as a mask until the first insulation layer is exposed, thereby forming a final gate pattern.

2. The method of claim 1, wherein the first insulation layer or the second insulation layer includes an oxide layer.

3. The method of claim 2, wherein the oxide layer includes a boro-phospho-silicate glass (BPSG) layer or a tetra-ethyl-ortho-silicate (TEOS) layer.

4. The method of claim 1, wherein the first conductive layer includes a material identical to that of the second conductive layer.

5. The method of claim 4, wherein the first and the second conductive layers include a polysilicon layer.

6. The method of claim 1, wherein filling the second conductive layer includes:
    forming the second conductive layer over the second insulation layer to fill the recess; and
    planarizing the second conductive layer until a surface of the second insulation layer is exposed.

7. The method of claim 6, wherein the second conductive layer is subject to a dry etch-back process in planarizing the second conductive layer.

8. The method of claim 7, wherein the dry etch-back process is performed with a high etch selectivity ratio between the second insulation layer and the second conductive layer.

9. The method of claim 8, wherein the second insulation layer includes an oxide layer, the second conductive layer includes a polysilicon layer, and the dry etch-back process is performed by using a gas mixture including hydrogen bromide (HBr)/oxygen ($O_2$)/hexafluoroethane ($C_2F_6$).

10. The method of claim 9, wherein the gas mixture has a flow rate of approximately 50 sccm to approximately 100 sccm.

11. The method of claim 9, wherein the dry etch-back process is performed in a condition that a source power of approximately 300 W to approximately 500 W and a bias power of approximately 40 W to approximately 150 W are applied.

12. The method of claim 1, wherein the gate electrode metal layer includes a tungsten (W)-based compound.

13. The method of claim 12, wherein the W-based compound includes tungsten (W), tungsten nitride (WN) or tungsten silicide (WSix).

14. The method of claim 1, further comprising forming a gate hard mask layer between the gate electrode metal layer and the gate mask pattern.

15. The method of claim 14, wherein the gate hard mask layer includes a nitride-based thin film.

16. The method of claim 1, wherein the gate mask layer includes an amorphous carbon layer.

17. The method of claim 1, further comprising a cleaning process using ozone ($O_3$) before forming the capping layer.

18. The method of claim 1, wherein the capping layer includes a nitride layer.

19. The method of claim 1, wherein forming the recess includes:

forming a recess mask;

etching the sacrificial layers using the recess mask to expose a portion of the substrate for the recess; and etching the exposed portion of the substrate to form the recess.

* * * * *